United States Patent
So et al.

(10) Patent No.: US 7,834,443 B2
(45) Date of Patent: Nov. 16, 2010

(54) SEMICONDUCTOR DEVICE WITH MOLTEN METAL PREVENTING MEMBER

(75) Inventors: Tsuyoshi So, Kawasaki (JP); Hideo Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 178 days.

(21) Appl. No.: 12/222,233

(22) Filed: Aug. 5, 2008

(65) Prior Publication Data
US 2008/0296755 A1    Dec. 4, 2008

Related U.S. Application Data

(63) Continuation of application No. PCT/JP2006/303386, filed on Feb. 24, 2006.

(51) Int. Cl.
*H01L 23/12* (2006.01)
(52) U.S. Cl. ............... 257/704; 257/707; 257/E23.109
(58) Field of Classification Search .......... 257/E23.057, 257/E23.071
See application file for complete search history.

(56) References Cited

U.S. PATENT DOCUMENTS 6,773,963 B2 *    8/2004  Houle .................... 438/122

2001/0050428 A1    12/2001  Ando et al.
2004/0026777 A1     2/2004  Yokoyama et al.

FOREIGN PATENT DOCUMENTS

| JP | 60-242647  | 2/1985  |
| JP | 63-310139  | 12/1988 |
| JP | 02-079451  | 3/1990  |
| JP | 2001-267473 | 9/2001 |
| JP | 2004-071977 | 3/2004 |

OTHER PUBLICATIONS

International Search Report of PCT Application No. PCT/JP2006/303386 (mailed May 30, 2006).

* cited by examiner

*Primary Examiner*—Stephen W Smoot
(74) *Attorney, Agent, or Firm*—Fujitsu Patent Center

(57) ABSTRACT

A semiconductor includes a board, a semiconductor element mounted on the board, an electronic component, with the semiconductor element, mounted on the board, a heat radiation member provided so as to face the board, the heat radiation member configured to radiate heat of the semiconductor element, and a thermal connecting member being configured to thermally connect the heat radiation member and the semiconductor element. A metal material is used as the thermal connecting member, and an adhesion preventing member is provided so as to be separated from the electronic component, the adhesion preventing member being configured to prevent the metal material molten and flowing at a heating time being adhered to the electronic component.

9 Claims, 4 Drawing Sheets

US 7,834,443 B2

SEMICONDUCTOR DEVICE WITH MOLTEN METAL PREVENTING MEMBER

CROSS-REFERENCE TO RELATED APPLICATION

This application is a U.S. continuation application filed under 35 USC 111(a) claiming benefit under 35 USC 120 and 365(c) of PCT application JP2006/303386, filed Feb. 24, 2006. The foregoing applications are hereby incorporated herein by reference.

BACKGROUND OF THE INVENTION

1. Field of the Invention

The present invention generally relates to semiconductor devices. More specifically, the present invention relates to a semiconductor device where a semiconductor element and other electronic components are provided on a board, the semiconductor device having a lid thermally connected to the semiconductor element.

2. Description of the Related Art

FIG. 1 is a cross-sectional view of a semiconductor device 1 of an example of a conventional art case. In the semiconductor device 1, a semiconductor element 2 and chip components 4 are mounted on an upper surface of a package board 3. The chip components 4 are, for example, surface terminal type capacitors.

In addition, a lid 5 is provided on the upper surface of the package board 3 so as to cover the semiconductor element 2 and the chip components 4. The lid 5 is thermally connected to the semiconductor element 2 via a thermal connecting member 7. Heat generated from the semiconductor element 2 is radiated by the lid 5 via the thermal connecting member 7. Furthermore, plural solder balls 6 as external connection terminals are provided on a rear surface of the package board 3.

It is general and conventional practice to use resin having insulating properties as the thermal connecting member 7. However, heat generated by such semiconductor elements 2 is increasing due to recent high densification of the semiconductor elements 2. Accordingly, thermal conductivity of the thermal connecting member 7 made of resin is not sufficient and therefore it is not possible to effectively transfer the heat from the semiconductor element 2.

Because of this, instead of the insulating resin, a thermal connecting member made of a metal material having thermal conductivity higher than that of the insulating resin has been used.

However, in a case where solder is used as the metal material forming the thermal connecting member 7, since the solder balls 6 as the external connection terminals are also made of solder, when heat is applied for mounting the semiconductor device 1, the thermal connecting member 7 is made molten along with the solder balls 6. When the thermal connecting member 7 is melted, the thermal connecting member 7 flows along the internal surface of the lid 5 and thereby a part of the thermal connecting member 7 flows down as shown by arrows in FIG. 1 so as to be adhered to the chip components 4. If the thermal connecting member 7 is adhered to the chip components 4 as discussed above, electric shorts are generated in the chip components 4 and therefore the semiconductor device 1 does not properly work.

As a method for not affecting the chip components 4 even if the thermal connecting member 7 is melted and flows down from the lid 5, there is a method (discussed in Patent Document 1 mentioned below) for sealing the chip components 4 with sealing resin 9. FIG. 2A is an expanded view showing a chip component 4 that is sealed by the sealing resin 9.

According to the above-mentioned method, even if the thermal connecting member 7 flows down, since the chip component 4 is protected by the sealing resin 9, it is possible to prevent electric shorts being from being generated in the chip component 4 due to the thermal connecting member 7.

[Patent Document 1] Japanese Laid-Open Patent Application Publication No. 60-242647

In the meantime, it is general practice that plural solder arranging parts 8 are provided on a surface of the chip component 4 such as a surface terminal type capacitor. The solder arranging parts 8 are fixed to the package board 3 by the solder. By the soldering, the chip components 4 are mounted on the package board 3. The solder arranging parts 8 as well as the solder balls 6 and the thermal connecting member 7 are made molten when heat is applied for mounting the semiconductor device 1.

However, in a case where the chip components 4 (the solder arranging parts 8) are sealed by the sealing resin 9, flow paths of the molten solder are blocked by the sealing resin 9. In addition, the volume of the solder increases when heat is applied to the solder.

Because of this, the solder melted at the solder arranging parts 8 flows on an interface of the solder arranging parts 8 and the sealing resin 9. At a part where adhesion properties of the solder arranging parts 8 and the sealing resin 9 are low, an electric short is generated neighboring the solder arranging parts 8 as shown by an arrow A in FIG. 2B. Thus, in the case where the sealing resin 9 is provided, while electric shorts due to the molten thermal connecting member 7 can be prevented, the electric shorts may be generated in the sealing resin 9.

SUMMARY OF THE INVENTION

Accordingly, embodiments of the present invention may provide a novel and useful semiconductor device solving one or more of the problems discussed above.

More specifically, the embodiments of the present invention may provide a semiconductor device whereby generation of electric shorts inside the device can be prevented even if a metal material is used for a thermal connecting member.

One aspect of the present invention may be to provide a semiconductor device, including a board, a semiconductor element mounted on the board, an electronic component, with the semiconductor element, mounted on the board, a heat radiation member provided so as to face the board, the heat radiation member configured to radiate heat of the semiconductor element, and a thermal connecting member being configured to thermally connect the heat radiation member and the semiconductor element, wherein a metal material is used as the thermal connecting member, and an adhesion preventing member is provided so as to be separated from the electronic component, the adhesion preventing member being configured to prevent the metal material molten and flowing at a heating time being adhered to the electronic component.

According to the above-mentioned semiconductor device, it is possible to achieve good thermal conductivity between the heat radiation member and the semiconductor element by using a metal material as the thermal connecting member. In addition, even if the thermal connecting member (metal material) is made molten due to heat at a mounting time of the semiconductor device, it is possible to prevent the melted and flowing metal material from being adhered to the electronic component by an adhesion preventing member. Furthermore, since the adhesion prevention member is provided so as to be separated from the electronic component, it is possible to prevent generation of electric shorts on the electronic component due to the connecting member such as solder configured to connect the electronic component and the board.

Solder may be used as the metal material. With this structure, the heat radiation member and the semiconductor element can be thermally connected to each other by a soldering process using the solder as the metal material. Accordingly, it is possible to thermally connect the heat radiation member and the semiconductor element by a simple process.

The adhesion preventing member may be a sheet-shaped covering member configured to cover the electronic component. Under this structure, it is possible to prevent the metal material (thermal connecting member) reaching the electronic component with a simple structure. In addition, since the sheet-shaped covering member is thin, even if the covering member is provided, it is possible to prevent the semiconductor device from having a large size (high tall).

The adhesion preventing member may be a sheet-shaped covering member configured to cover the electronic component, and one end of the covering member may be fixed to the board and another end of the covering member may be a free end. The adhesion preventing member may be a sheet-shaped covering member configured to cover the electronic component, and both ends of the covering member may be fixed to the board. The adhesion preventing member may be a sheet-shaped covering member configured to cover the electronic component, and the covering member may be made of polyimide. The adhesion preventing member may be provided at an external circumferential position relative to a position where the thermal connecting member of the heat radiation member is thermally connected and a position facing at least the electronic component, and the adhesion preventing member may be configured to block the flow of the thermal connecting member on the heat radiation member at the time when the thermal connecting member is molten.

Under this structure, even if the metal material is made molten due to heat at the mounting time of the semiconductor device, the flow of the metal material is blocked by the adhesion preventing member so as not to reach a position facing the electronic component. Because of this, even if the thermal connecting member is melted, it is possible to prevent the thermal connecting member from being adhered to the electronic component. Furthermore, since the adhesion preventing member is provided so as to be separated from the electronic component, it is possible to prevent generation of the electric shorts on the electronic component due to the connecting member such as solder configured to connect the above-mentioned electronic component and the board to each other.

The adhesion preventing member may be provided at an external circumferential position relative to a position where the thermal connecting member of the heat radiation member is thermally connected and a position facing at least the electronic component, and the adhesion preventing member may include a resin sheet. The adhesion preventing member may be provided at an external circumferential position relative to a position where the thermal connecting member of the heat radiation member is thermally connected and a position facing at least the electronic component, and gold plating may be applied on a surface of the heat radiation member thermally connected to the thermal connecting member.

According to the embodiment of the present invention, it is possible to provide a semiconductor device whereby good thermal conductivity between a heat radiation member and a semiconductor element is achieved; a molten and flowing metal material is prevented from being adhered to an electronic component; and generation of electric shorts on the electronic component is prevented by a connecting member configured to connect the electronic component and a board.

Other objects, features, and advantages of the present invention will become more apparent from the following detailed description when read in conjunction with the accompanying drawings.

DETAILED DESCRIPTION OF THE PREFERRED EMBODIMENTS

A description is given below, with reference to the FIG. 3 through FIG. 7 of embodiments of the present invention.

Figure 3:
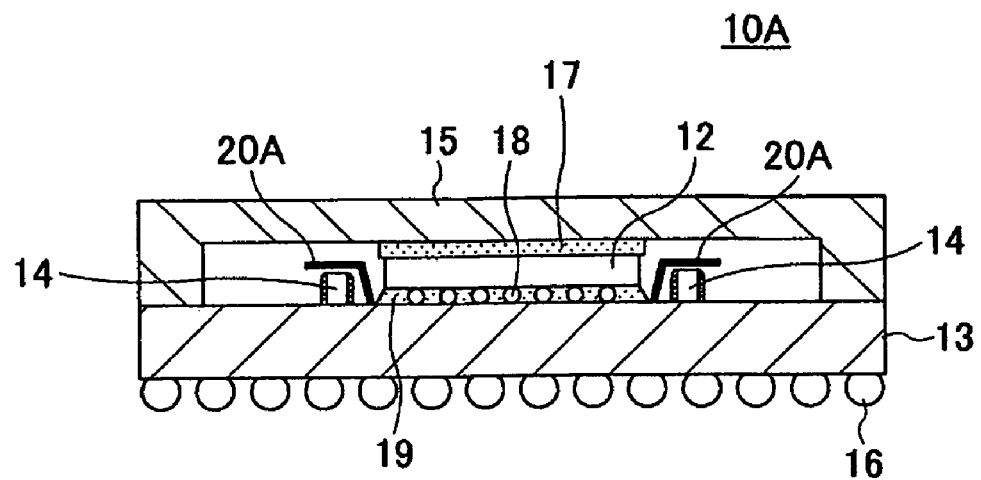
FIG. 3 is a cross-sectional view of a semiconductor device of a first embodiment of the present invention.

FIG. 3 is a cross-sectional view of a semiconductor device 10A of a first embodiment of the present invention. The semiconductor device 10A includes a semiconductor element 12, a package board 13, chip components 14, a lid 15, a thermal connecting member 17, adhesion preventing sheets 20A, and others.

The semiconductor element 12 is a high density element and generates a great amount of heat. The semiconductor element 12 is flip chip mounted on the package board 13. More specifically, solder bumps 17 are provided on a main surface of the semiconductor element 12. The semiconductor element 12 is mounted on the package board 13 by connecting the solder bumps 18 to bonding pads (not shown in FIG. 3) formed on a surface of the package board 13. In addition, underfill resin 19 is provided between the semiconductor element 12 and the package board 13 so as to reinforce the solder bumps 18.

The package board 13 is, for example, a multilayer printed wiring board. The chip components 14, the lid 15 and the adhesion preventing sheets 20A, along with the semiconductor element 12, are provided on the upper surface of the package board 13. In addition, solder balls 16 as external connection terminals are provided on the rear surface of the package board 13. The semiconductor element 12 and the solder balls 16 are electrically connected to each other by interlayer wirings or the like provided in the package board 13.

Figure 1:
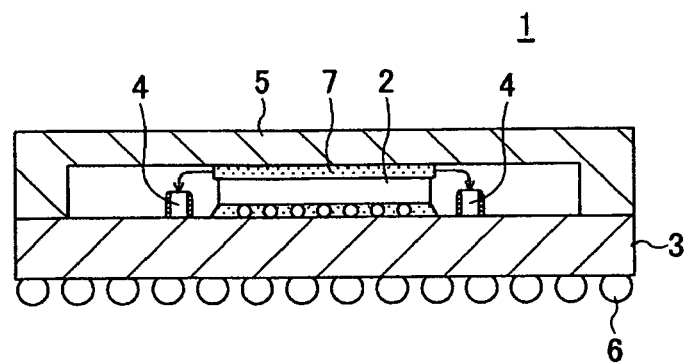
FIG. 1 is a cross-sectional view of a semiconductor device of an example of a conventional art case.
Figure 2A:
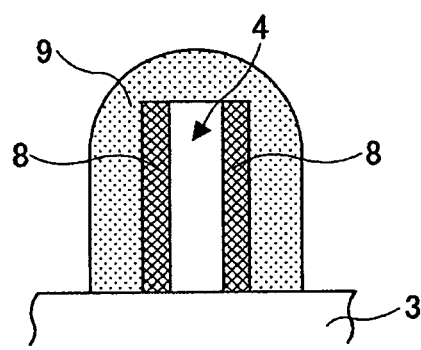
FIG. 2A is a view showing a structure where a chip component is sealed by sealing resin.

The chip component 14 is an electronic component such as a surface terminal type capacitor. The chip components 14 are provided in external circumferential positions relative to the semiconductor element 12. The chip component 14 has the same structure as that of the chip component 4 shown in FIG. 2(A). Solder arranging parts (not shown) connect the chip components 4 to the package board 13.

The lid 15 is made of a metal material having high conductivity and works as a heat radiating member. The lid 15 is fixed to the package board 13 by using, for example, an adhesive. Furthermore, the lid 15 has a cap-shaped configuration and covers the substantially entire upper surface of the package board 13. Accordingly, the semiconductor element 12 and the chip components 14 are sealed inside the lid 15 by the lid 15 being fixed to the package board 13.

The thermal connecting member 17 is provided between the semiconductor element 12 and the lid 15. The thermal connecting member 17 is configured to thermally connect the semiconductor element 12 and the lid 15 to each other. The thermal connecting member 17 is made of a metal material having high thermal conductivity. In this embodiment, solder is used as the metal material forming the thermal connecting member 17. Since it is possible to thermally connect the semiconductor element 12 and the lid 15 to each other by a soldering process using the solder that is the metal material forming the thermal connecting member 17, it is possible to thermally connect the semiconductor element 12 and the lid 15 with a simple process.

As discussed above, by thermally connecting the semiconductor element 12 and the lid 15 with the thermal connecting member 17 having high thermal conductivity, it is possible to efficiently transfer heat generated by the semiconductor element 12 to the lid 15 and radiate the heat. However, in a case where solder is used as the thermal connecting member 17, as discussed above, the thermal connecting member is melted along with the solder balls 16 by heat applied for mounting so as to flow along the internal surface of the lid 15. As a result of this, a part of the thermal connecting member 17 may flow down and be adhered to the chip components 14.

Because of this, in the semiconductor device 10A, an adhesion preventing member 20A is provided so as to prevent the thermal connecting member (solder) 17, which is melted and flows at the heating time, being adhered to the chip components 14. In this example, the adhesion preventing sheets 20A are provided as an adhesion preventing part. The adhesion preventing sheets 20A are made of resin such as polyimide and have upside-down bent L-shaped configurations. Furthermore, one end of the adhesion preventing sheet 20A is adhered and fixed to the package board 13 and another end of the adhesion preventing sheet 20A is a free end. In addition, the adhesion preventing sheets 20A are fixed to the package board 13 in a position closer to the semiconductor element 12 than are the chip components 14. The adhesion preventing sheets 20A are separated from the chip components 14 and cover at least the entire upper surfaces of the chip components 14.

Because of this, even if solder is used as the thermal connecting member 17 or the thermal connecting member 17 is made molten by heat for mounting or the like and flows down from the lid 15 to the chip components 14, the melted solder of the thermal connecting member 17 is received by the adhesion preventing sheet 20A having the structures discussed above. Hence, it is possible to prevent the melted thermal connecting member 17 from being adhered to the chip components 14.

Figure 2B:
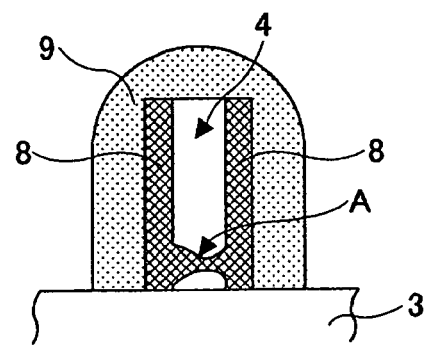
FIG. 2B is a view for explaining problems of the conventional art.

In addition, the adhesion preventing sheet 20A are provided so as to be separated from the chip components 14. Because of this, the chip components 4 discussed with reference to FIG. 2 are completely sealed by the sealing resin 9. Hence, even if the solder arranging parts of the chip components 14 are melted and expanded due to the heat, it is possible to prevent generation of electric shorts between the neighboring solder arranging parts.

According to the semiconductor device 10A of this example, it is possible to effectively prevent electric shorts due to the melted thermal connecting member 17 and electric short due to the solder arranging parts. Hence, it is possible to improve reliability of the semiconductor device 10A. In addition, by using the sheet-shaped adhesion preventing sheet 20A as the adhesion preventing part, it is possible to prevent the melted thermal connecting member 17 from being adhered to the chip components 14 with a simple structure.

Furthermore, since the sheet-shaped adhesion preventing sheet 20A is thin, providing the adhesion preventing sheet 20A does not cause the semiconductor device 10A to have a large size (high tall). In addition, since only one end of each of the adhesion preventing sheets is fixed to the package board 13, it is possible to reduce the amount of the adhesive used.

Figure 4:
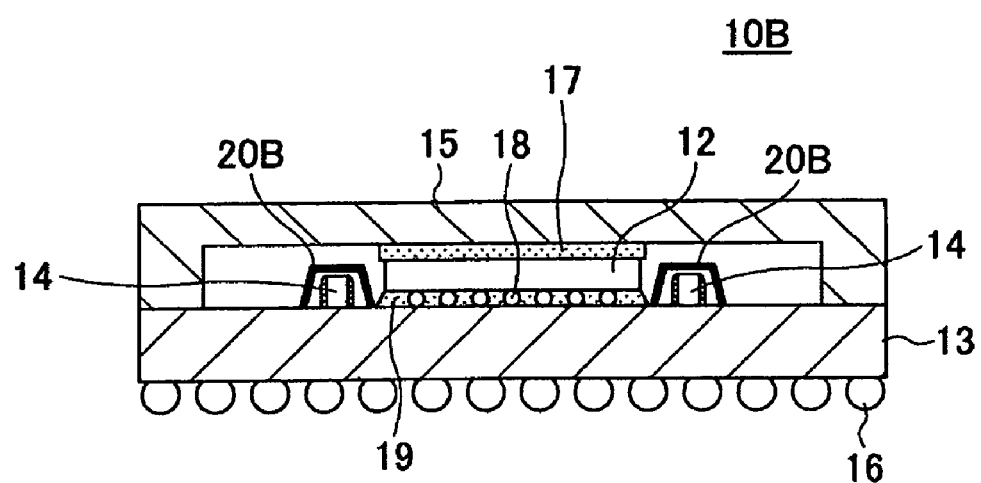
FIG. 4 is a cross-sectional view of a semiconductor device of a first modified example of the first embodiment of the present invention.
Figure 5:
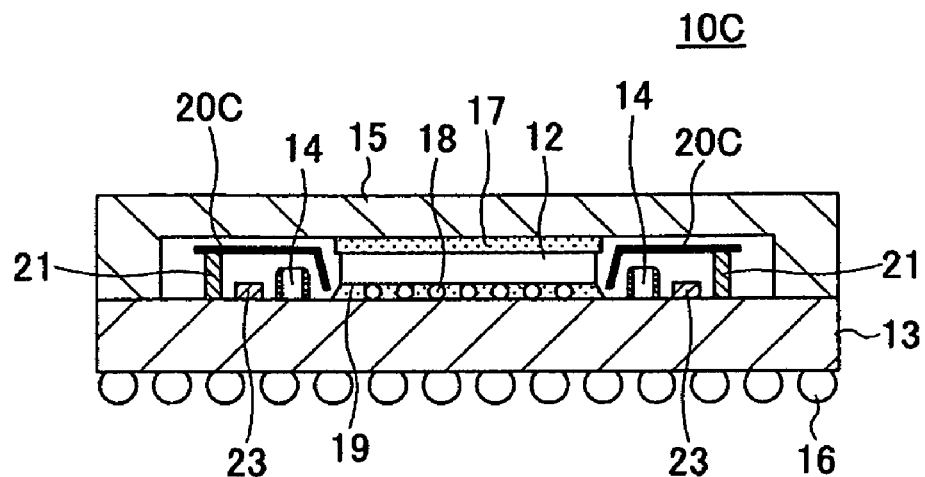
FIG. 5 is a cross-sectional view of a semiconductor device of a second modified example of the first embodiment of the present invention.

FIG. 4 shows a first modified example of the semiconductor device 10A of the first embodiment of the present invention. FIG. 5 shows a second modified example of the semiconductor device 10A of the first embodiment of the present invention. In FIG. 4 and FIG. 5, parts that are the same as the parts shown in FIG. 3 are given the same reference numerals, and explanation thereof is omitted. In addition, in FIG. 6 and FIG. 7 referring to the explanation of a second embodiment of the present invention, parts that are the same as the parts shown in FIG. 3 are given the same reference numerals, and explanation thereof is omitted.

In the semiconductor device 10A of the first embodiment of the present invention discussed above, only one end of each of the adhesion preventing sheets 20A is fixed to the package board 13. On the other hand, in a semiconductor device 10B of the first modified example shown in FIG. 4, both ends of adhesion preventing sheets 20B are fixed to the package board 13. Because of this structure, it is possible to fix the adhesion preventing sheet 20B to the package board 13 more rigidly than the structure of the first embodiment. Accordingly, even if a large amount of the molten thermal connecting member 17 flow down, it is possible to prevent generation of electric shorts.

In a semiconductor device 10C of the second modified example shown in FIG. 5, adhesion preventing sheet 20C are supported by pillars 21 standing on the package board 13. In addition, openings are formed in portions corresponding to the position of the semiconductor element 12. With this structure, the adhesion preventing sheet 20C covers a wider area of the package board 13 compared to the semiconductor devices 10A and 10B. Because of this, it is possible to prevent the melted thermal connecting members 17 being adhered to other electronic components 23 provided on the package board 13 with the chip components 14, by a single adhesion preventing sheet 20C.

Next, a semiconductor device 10C of the second embodiment of the present invention is discussed.

Figure 6:
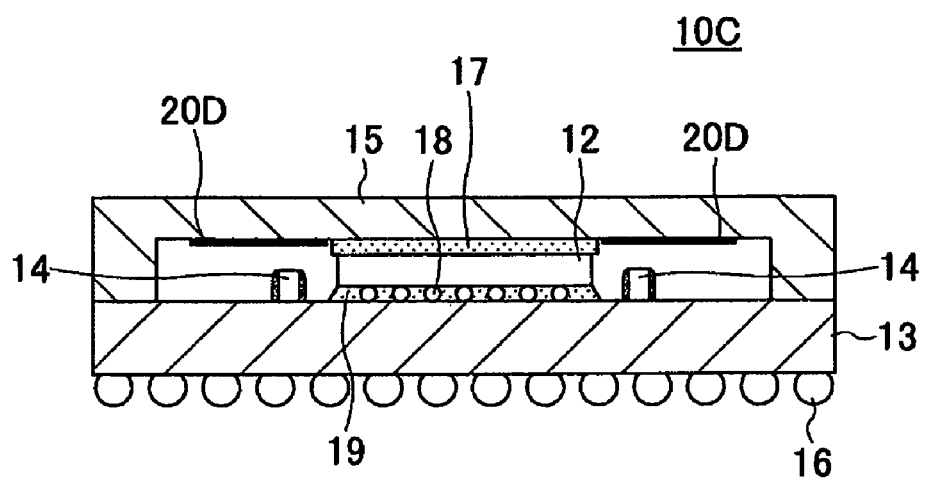
FIG. 6 is a cross-sectional view of a semiconductor device of a second embodiment of the present invention.
Figure 7:
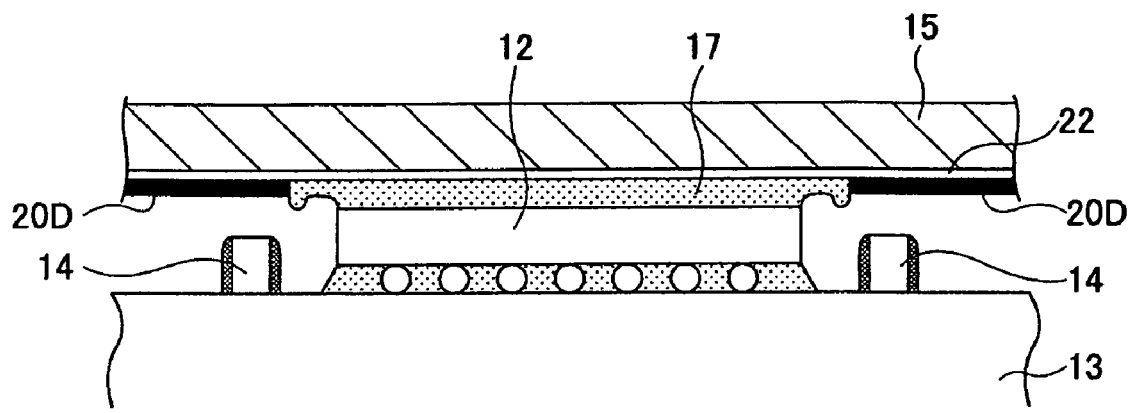
FIG. 7 is an expanded cross-sectional view showing the vicinity of a thermal connecting part of FIG. 6.

FIG. 6 is a cross-sectional view of a semiconductor device 10C of the second embodiment of the present invention. FIG. 7 is an expanded cross-sectional view showing the vicinity of a thermal connecting part 17 of FIG. 6. In this embodiment, an adhesion preventing sheet 20D is provided at the lid 15 as the adhesion preventing part.

The adhesion preventing sheet 20D is formed of sheet-shaped polyimide in this embodiment as well as the first embodiment. In addition, the adhesion preventing sheet 20D is adhered and fixed to the internal surface of the lid 15. Thus, by providing the adhesion preventing sheet 20D on the internal surface of the lid 15, the adhesion preventing sheet 20D is separated from the chip components 14. Furthermore, the adhesion preventing sheet 20D is positioned external to circumferential positions of an area where the lid 15 is thermally connected to the thermal connecting member 17 and an area including a position facing at least the chip components 14.

As discussed above, the thermal connecting member 17 may be melted by heat for mounting. In addition, the thermal connecting member 17 is adhered to the internal surface of the lid 15 by soldering. Accordingly, a gold plating 22 (see FIG. 7) is formed on the internal surface of the lid 15. The gold plating 22 is configured to improve the ability to connect (wetability) to the thermal connecting member 17 made of solder. In a case where the thermal connecting member 17 can be well formed to the lid 15 by providing the gold plating 22 but the thermal connecting member 17 is melted by heat for mounting, the thermal connecting member 17 easily flow on the internal surface of the lid 15 due to the gold plating 22 having high wetability.

However, in the semiconductor device 10C of the second embodiment, the adhesion preventing sheet 20D is provided on the internal surface of the lid 15, namely the gold plating 22. Therefore, flow of the melted thermal connecting member 17 on the internal surface of the lid 15 is blocked by the adhesion preventing sheet 20D. In other words, the adhesion preventing sheet 20D works as a dam member configured to block the flow of the molten thermal connecting member 17. FIG. 7 shows the flow of the melted thermal connecting member 17 being blocked by the adhesion preventing sheet 20D.

Thus, in this embodiment as well as the first embodiment, it is possible to prevent the melted thermal connecting member 17 from flowing down on the chip components 14. In addition, since the adhesion preventing sheet 20D is provided in a wide area even at upper parts of the chip components 14, even if a large amount of the thermal connecting member 17 is melted and a part of the thermal connecting member 17 goes to the upper part of the adhesion preventing sheet 20D, it is possible to prevent the part of the thermal connecting members 17 from flowing to the upper parts of the chip components 14.

Although the adhesion preventing sheet 20D as the adhesion preventing part is fixed to the lid 15 in the second embodiment of the present invention, the present invention is not limited this. For example, a solder resist may be applied to the lid 15 and the same effect can be achieved in this case.

Although the invention has been described with respect to specific embodiment for a complete and clear disclosure, the appended claims are not to be thus limited but are to be construed as embodying all modifications and alternative constructions that may occur to one skilled in the art that fairly fall within the basic teachings herein set forth.

What is claimed is:

1. A semiconductor device, comprising:
    a board;
    a semiconductor element mounted on the board;
    an electronic component mounted on the board;
    a heat radiation member provided so as to face the board, the heat radiation member configured to radiate heat of the semiconductor element;
    a thermal connecting member being configured to thermally connect the heat radiation member and the semiconductor element,
    wherein a metal material is used as the thermal connecting member; and
    a molten metal preventing member separated from the electronic component, the molten metal preventing member being configured to prevent the metal material molten and flowing at a heating time from adhering to the electronic component.

2. The semiconductor device as claimed in claim 1, wherein the metal material is solder.

3. The semiconductor device as claimed in claim 1, wherein the molten metal preventing member is a sheet-shaped covering member configured to cover the electronic component.

4. The semiconductor device as claimed in claim 1, wherein the molten metal preventing member is a sheet-shaped covering member configured to cover the electronic component, and
one end of the covering member is fixed to the board and another end of the covering member is a free end.

5. The semiconductor device as claimed in claim 1, wherein the molten metal preventing member is a sheet-shaped covering member configured to cover the electronic component, and
both ends of the covering member are fixed to the board.

6. The semiconductor device as claimed in claim 1, wherein the molten metal preventing member is a sheet-shaped covering member configured to cover the electronic component, and
the covering member is made of polyimide.

7. The semiconductor device as claimed in claim 1, wherein the molten metal preventing member is provided at an external circumferential position relative to a position where the thermal connecting member of the heat radiation member is thermally connected and a position facing at least the electronic component, and
the molten metal preventing member is configured to block the flow of the thermal connecting member on the heat radiation member at the time when the thermal connecting member is molten.

8. The semiconductor device as claimed in claim 1, wherein the molten metal preventing member is provided at an external circumferential position relative to a position where the thermal connecting member of the heat radiation member is thermally connected and a position facing at least the electronic component, and
the molten metal preventing member includes a resin sheet.

9. The semiconductor device as claimed in claim 1, wherein the molten metal preventing member is provided at an external circumferential position relative to a position where the thermal connecting member of the heat radiation member is thermally connected and a position facing at least the electronic component, and
gold plating is applied on a surface of the heat radiation member thermally connected to the thermal connecting member.

* * * * *